US010498992B2

(12) United States Patent
Kim

(10) Patent No.: US 10,498,992 B2
(45) Date of Patent: Dec. 3, 2019

(54) SINGLE-SLOPE COMPARISON DEVICE WITH LOW-NOISE, AND ANALOG-TO-DIGITAL CONVERSION DEVICE AND CMOS IMAGE SENSOR INCLUDING THE SAME

(71) Applicant: SK hynix Inc., Icheon-si (KR)

(72) Inventor: Hyeon-June Kim, Yeosu-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/177,944

(22) Filed: Nov. 1, 2018

(65) Prior Publication Data

US 2019/0158772 A1 May 23, 2019

(30) Foreign Application Priority Data

Nov. 17, 2017 (KR) ........................ 10-2017-0154039

(51) Int. Cl.

*H04N 5/374* (2011.01)
*H04N 5/3745* (2011.01)
*G11C 27/02* (2006.01)
*H04N 5/378* (2011.01)
*G11C 7/06* (2006.01)

(52) U.S. Cl.

CPC ........... *H04N 5/37455* (2013.01); *G11C 7/06* (2013.01); *G11C 27/024* (2013.01); *H04N 5/378* (2013.01); *H04N 5/3741* (2013.01); *G11C 2207/068* (2013.01)

(58) Field of Classification Search

CPC .............................. H04N 5/37455; G11C 7/06
USPC .......................................................... 348/308
See application file for complete search history.

(56) References Cited

U.S. PATENT DOCUMENTS

2015/0188561 A1* 7/2015 Narayan ............. H03M 1/0604 341/118
2016/0360138 A1* 12/2016 Meynants ......... H01L 27/14609

FOREIGN PATENT DOCUMENTS

KR 10-2008-0019376 3/2008
KR 10-2013-0097989 9/2013

* cited by examiner

*Primary Examiner* — Joel W Fosselman
(74) *Attorney, Agent, or Firm* — Perkins Coie LLP

(57) ABSTRACT

A comparison device includes an MSB voltage generation circuit that includes a control signal terminal to generate an MSB voltage; a comparison circuit including a first input terminal receiving a first input signal and a second input terminal receiving a second input signal modified by the MSB voltage outputted from the MSB voltage generation circuit to move to a desired voltage range by comparing the first input signal with the modified second input signal to output an MSB comparison result signal, the comparison circuit, after the first input signal has reached the desired voltage range, comparing the first input signal with a residue voltage and outputting an LSB comparison result signal; and a control circuit receiving the comparison signal and operable to detect a crossing of the first input signal and the second input signal according to the MSB comparison result signal and to output the MSB voltage control signal.

24 Claims, 11 Drawing Sheets

V
T
V_MSB
V_IN1
V_MSB-Step
(= Residue range)
V_MSB1
V_A/D_MSB
V_MSB1
V_MSB2
V_MSB3
V_A/D_LSB
V_Multi_LSB
ANALOG-TO-DIGITAL CONVERSION

SINGLE-SLOPE COMPARISON DEVICE WITH LOW-NOISE, AND ANALOG-TO-DIGITAL CONVERSION DEVICE AND CMOS IMAGE SENSOR INCLUDING THE SAME

CROSS-REFERENCE TO RELATED APPLICATION

This patent document claims the priority and benefits of Korean Patent Application No. 10-2017-0154039, filed on Nov. 17, 2017, which is incorporated herein by reference in its entirety.

TECHNICAL FIELD

The technology and implementations disclosed in this patent document relate to an analog-to-digital conversion device and a complementary metal oxide semiconductor (CMOS) image sensor.

BACKGROUND

The high-speed readout and low power consumption are important parameters to consider in designing CMOS image sensors. However, there is a trade-off between the high-speed readout and low power consumption. The demand for CMOS image sensors with more and more pixels leads to an increased bandwidth of readout circuitry in order to read out the increased number of pixels within a short frame of time. To facilitate the high-speed readout of large pixel array without consuming much power, therefore, a column-parallel architecture may be used.

In a column-parallel analog-to-digital converter (ADC) architecture of the CMOS image sensor, a single-slope ADC is often used because it can be implemented using a very simple column circuit and requires much less chip area than other types of ADC.

Recently, a multi-sampling technique has been proposed to improve a noise cancellation performance in the CMOS image sensor by sampling an input signal multiple times and analog-to-digital converting and by averaging sampled input signals.

The single-slope ADC device, however, is often accompanied with an increase in the number of clocks to sample an input signal multiple times and analog-to-digital convert the sampled input signals. For instance, a 10-bit analog-to-digital conversion requires 1024 clocks, and thus a 10-bit multi-sampling analog-to-digital conversion may require at least 2048 clocks. Such an increase in the clock cycles for processing reduces the image processing speed of the imaging device and thus is undesirable.

As an alternative to the multi-sampling technique discussed above, a multi-sampling operation can be performed by increasing a slope of a ramp signal by multiple times, e.g., ranging from ×1 to ×16, during the 1024 clocks to perform the 10-bit analog-to-digital conversion. As the slope of the ramp signal increases, however, it becomes more difficult to settle the ramp signal properly.

Since a noise performance is an important factor for maintaining a satisfactory imaging performance at a low illuminance, the ADC converter often uses different types of ramp signal generation devices including a ramp signal generation device for a low illuminance and another ramp signal generation device for a high illuminance. For example, if an input signal is within 300 least significant bit (LSB) of a whole reference value of 1024 LSB, its illuminance condition is identified as a low illuminance, and thus an analog-to-digital conversion is performed by multi-sampling the ramp signal three times with the slope of 1-300 LSB. If the input signal is over 300 LSB of the whole reference value of 1024 LSB, its illuminance condition is identified as a high illuminance, and thus an analog-to-digital conversion is performed by sampling the ramp signal with the slope of 1-1024 LSB.

Various implementations of the above-described technology, however, tend to exhibit a non-linear characteristic due to a characteristic difference between the two different ramp signal generation devices.

As a different approach, a double analog-to-digital conversion may be performed by driving two ramp signals outputted from two different ramp signal generation devices are driven through different buffers having different offset values. The two ramp signals have multiple crossings with an input signal, and the crossings occur sequentially with a predetermined delay.

However, it is difficult to guarantee a characteristic difference (e.g., a temperature variation) and an offset generation of each buffer.

SUMMARY

This patent document provides, among others, designs of image sensing devices that have an analog-to-digital converter with a single slope comparison device capable of sampling an input signal voltage multiple times with a least significant bit (LSB) step by changing a position of the input signal voltage.

In an embodiment, a comparison device may include a most significant bit (MSB) voltage generation block suitable for generating an MSB voltage according to an MSB voltage control signal; a comparison block suitable for comparing a first input signal with a second input signal having the MSB voltage outputted from the MSB voltage generation block, outputting an MSB comparison result signal, comparing the first input signal with a residue voltage and outputting a least significant bit (LSB) comparison result signal; and a control block suitable for detecting a crossing according to the MSB comparison result signal outputted from the comparison block and outputting the MSB voltage control signal to the MSB voltage generation block.

In an embodiment, an analog-to-digital conversion device may include a most significant bit (MSB) voltage generation block suitable for generating an MSB voltage according to an MSB voltage control signal; a comparison block suitable for comparing a first input signal with a second input signal having the MSB voltage outputted from the MSB voltage generation block, outputting an MSB comparison result signal, comparing the first input signal with a residue voltage and outputting a least significant bit (LSB) comparison result signal; a control block suitable for detecting a crossing according to the MSB comparison result signal outputted from the comparison block and outputting the MSB voltage control signal to the MSB voltage generation block; and a counting block suitable for performing an MSB counting operation according to the MSB comparison result signal outputted from the comparison block, performing an LSB counting operation according to the LSB comparison result signal, and averaging an MSB counting value and an LSB counting value.

In an embodiment, a complementary metal oxide semiconductor (CMOS) image sensor may include a pixel array suitable for outputting a pixel signal corresponding to an incident light; a row decoder suitable for selecting and controlling pixels of the pixel array row by row; a ramp signal generator suitable for generating a ramp signal having a residue range; a most significant bit (MSB) voltage generation block suitable for generating an MSB voltage according to an MSB voltage control signal; a comparison block suitable for comparing an offset voltage with a pixel signal having the MSB voltage outputted from the MSB voltage generation block, outputting an MSB comparison result signal, comparing a ramp signal having a residue range with a residue voltage and outputting a least significant bit (LSB) comparison result signal; a control block suitable for detecting a crossing according to the MSB comparison result signal outputted from the comparison block and outputting the MSB voltage control signal to the MSB voltage generation block; a counting block suitable for performing an MSB counting operation according to the MSB comparison result signal outputted from the comparison block, performing an LSB counting operation according to the LSB comparison result signal, and averaging an MSB counting value and an LSB counting value; a memory suitable for storing a counting information outputted from the counting block; a column read-out circuit suitable for outputting stored data of the memory; and a control unit suitable for controlling operations of the row decoder, the ramp signal generator, the comparison block, the counting block, the memory and the column read-out circuit.

In an embodiment, a complementary metal oxide semiconductor (CMOS) image sensor may include a pixel array suitable for outputting a pixel signal corresponding to an incident light;

a row decoder suitable for selecting and controlling pixels of the pixel array row by row; a ramp signal generator suitable for generating a ramp signal having a residue range; a most significant bit (MSB) voltage generation block suitable for generating an MSB voltage according to an MSB voltage control signal; a comparison block suitable for comparing a pixel signal with an offset voltage having the MSB voltage outputted from the MSB voltage generation block, outputting an MSB comparison result signal, comparing the pixel signal with a residue voltage and outputting a least significant bit (LSB) comparison result signal; a control block suitable for detecting a crossing according to the MSB comparison result signal outputted from the comparison block and outputting the MSB voltage control signal to the MSB voltage generation block; a counting block suitable for performing an MSB counting operation according to the MSB comparison result signal outputted from the comparison block, performing an LSB counting operation according to the LSB comparison result signal, and averaging an MSB counting value and an LSB counting value; a memory suitable for storing a counting information outputted from the counting block; a column read-out circuit suitable for outputting stored data of the memory; and a control unit suitable for controlling operations of the row decoder, the ramp signal generator, the comparison block, the counting block, the memory and the column read-out circuit.

In an embodiment of the disclosed technology, a comparison device may include a most significant bit (MSB) voltage generation circuit that includes a control signal terminal to receive an MSB voltage control signal and is structured to generate an MSB voltage; a comparison circuit including a first input terminal coupled to receive a first input signal and a second input terminal coupled to receive a second input signal that is modified by the MSB voltage outputted from the MSB voltage generation circuit to output an MSB comparison result signal, the comparison circuit comparing the first input signal with a residue voltage and outputting a least significant bit (LSB) comparison result signal; and a control circuit coupled to the comparison circuit to receive the comparison signal and operable to detect a crossing of the first input signal and the second input signal according to the MSB comparison result signal and to output the MSB voltage control signal to the MSB voltage generation circuit.

In an embodiment of the disclosed technology, an analog-to-digital conversion device may include a most significant bit (MSB) voltage generation circuit that includes a control signal terminal to receive an MSB voltage control signal and is structured to generate an MSB voltage; a comparison circuit including a first input terminal coupled to receive a first input signal and a second input terminal coupled to receive a second input signal that is modified by the MSB voltage outputted from the MSB voltage generation circuit to output an MSB comparison result signal, the comparison circuit comparing the first input signal with a residue voltage and outputting a least significant bit (LSB) comparison result signal; a control circuit coupled to the comparison circuit to receive the comparison signal and operable to detect a crossing of the first input signal and the second input signal according to the MSB comparison result signal and to output the MSB voltage control signal to the MSB voltage generation circuit; and a counting circuit coupled to the comparison circuit to perform an MSB counting operation according to the MSB comparison result signal outputted from the comparison circuit and to perform an LSB counting operation according to the LSB comparison result signal.

In an embodiment of the disclosed technology, a complementary metal oxide semiconductor (CMOS) image sensor may include a pixel array comprising pixels arranged in rows and columns wherein each pixel is operable to generate a pixel signal corresponding to incident light received at each pixel; a row decoder coupled to the pixel array and operable to select and control pixels of the pixel array row by row; a ramp signal generator structured to generate a ramp signal of a residue range; a most significant bit (MSB) voltage generation circuit structured to generate an MSB voltage according to an MSB voltage control signal; a comparison circuit suitable for comparing an offset reference voltage with a voltage at an input terminal of the comparison circuit obtained by adding or subtracting the MSB voltage to or from a pixel signal to modify the voltage at the input terminal to output an MSB comparison result signal, the comparison circuit comparing a ramp signal of a residue range with a residue voltage, which is the modified voltage at the input terminal, and outputting a least significant bit (LSB) comparison result signal; a control circuit coupled to the comparison circuit to receive the comparison signal and operable to detect a crossing of the offset reference voltage and the modified voltage at the input terminal according to the MSB comparison result signal and to output the MSB voltage control signal to the MSB voltage generation circuit; a counting circuit coupled to the comparison circuit to perform an MSB counting operation according to the MSB comparison result signal outputted from the comparison circuit and to perform an LSB counting operation according to the LSB comparison result signal; a memory coupled to the counting circuit and operable to store information outputted from the counting circuit; a column read-out circuit coupled to the memory and operable to output the information stored in the memory; and a control circuit coupled to and operable to control the row decoder, the ramp signal generator, the comparison circuit, the counting circuit, the memory and the column read-out circuit.

In an embodiment of the disclosed technology, a complementary metal oxide semiconductor (CMOS) image sensor may include a pixel array comprising pixels arranged in rows and columns wherein each pixel is operable to generate a pixel signal corresponding to incident light received at each pixel; a row decoder coupled to the pixel array and operable to select and control pixels of the pixel array row by row; a ramp signal generator structured to generate a ramp signal of a residue range; a most significant bit (MSB) voltage generation circuit structured to an MSB voltage according to an MSB voltage control signal; a comparison circuit suitable for comparing a pixel signal with an offset reference voltage that is modified by the MSB voltage outputted from the MSB voltage generation circuit to output an MSB comparison result signal, the comparison circuit comparing the pixel signal with a residue voltage to output a least significant bit (LSB) comparison result signal; a control circuit coupled to the comparison circuit to receive the comparison signal and operable to detect a crossing of the pixel signal and the modified offset reference voltage according to the MSB comparison result signal outputted from the comparison circuit to output the MSB voltage control signal to the MSB voltage generation circuit; a counting circuit coupled to the comparison circuit to perform an MSB counting operation according to the MSB comparison result signal outputted from the comparison circuit and to perform an LSB counting operation according to the LSB comparison result signal; a memory coupled to the counting circuit and operable to store information outputted from the counting circuit; a column read-out circuit coupled to the memory and operable to output the information stored in the memory; and a control circuit coupled to and operable to control the row decoder, the ramp signal generator, the comparison circuit, the counting circuit, the memory and the column read-out circuit.

In an embodiment of the disclosed technology, a comparison device includes a most significant bit (MSB) voltage generation circuit that includes an input port to receive an MSB voltage control signal and is structured to generate an MSB voltage, a comparison circuit including a first input port coupled to receive a first input signal and a second input port coupled to receive a second input signal that is modified by the MSB voltage outputted from the MSB voltage generation circuit to move to a desired voltage range by comparing the first input signal with the modified second input signal and to output an MSB comparison result signal, the comparison circuit, after the first input signal has reached to the desired voltage range, comparing the first input signal with a residue voltage and outputting a least significant bit (LSB) comparison result signal, and a control circuit coupled to the comparison circuit to receive the comparison signal and operable to detect a crossing of the first input signal and the second input signal according to the MSB comparison result signal and to output the MSB voltage control signal to the MSB voltage generation circuit.

In an embodiment of the disclosed technology, an analog-to-digital conversion device includes a most significant bit (MSB) voltage generation circuit that includes an input port to receive an MSB voltage control signal and is structured to generate an MSB voltage, a comparison circuit including a first input port coupled to receive a first input signal and a second input port coupled to receive a second input signal that is modified by the MSB voltage outputted from the MSB voltage generation circuit to move to a desired voltage range by comparing the first input signal with the modified second input signal and to output an MSB comparison result signal, the comparison circuit, after the first input signal has moved to the desired voltage range, comparing the first input signal with a residue voltage and outputting a least significant bit (LSB) comparison result signal, a control circuit coupled to the comparison circuit to receive the comparison signal and operable to detect a crossing of the first input signal and the second input signal according to the MSB comparison result signal and to output the MSB voltage control signal to the MSB voltage generation circuit, and a counting circuit coupled to the comparison circuit to perform an MSB counting operation according to the MSB comparison result signal outputted from the comparison circuit and to perform an LSB counting operation according to the LSB comparison result signal.

In an embodiment of the disclosed technology, an complementary metal oxide semiconductor (CMOS) image sensor includes a pixel array comprising pixels arranged in rows and columns wherein each pixel is operable to generate a pixel signal corresponding to incident light received at each pixel, a row decoder coupled to the pixel array and operable to select and control pixels of the pixel array row by row, a ramp signal generator structured to generate a ramp signal of a residue range, a most significant bit (MSB) voltage generation circuit structured to generate an MSB voltage according to an MSB voltage control signal, a comparison circuit suitable for comparing an offset reference voltage with a pixel signal that is modified by the MSB voltage outputted from the MSB voltage generation circuit to move to a desired voltage range by comparing the offset reference voltage with the modified pixel signal and to output an MSB comparison result signal, the comparison circuit, after the pixel signal has reached to the desired voltage range, comparing a ramp signal of a residue range with a residue voltage, which is the modified pixel signal that is in the desired voltage range, and outputting a least significant bit (LSB) comparison result signal, a control circuit coupled to the comparison circuit to receive the comparison signal and operable to detect a crossing of the offset reference voltage and the modified pixel signal according to the MSB comparison result signal and to output the MSB voltage control signal to the MSB voltage generation circuit, a counting circuit coupled to the comparison circuit to perform an MSB counting operation according to the MSB comparison result signal outputted from the comparison circuit and to perform an LSB counting operation according to the LSB comparison result signal, a memory coupled to the counting circuit and operable to store information outputted from the counting circuit, a column read-out circuit coupled to the memory and operable to output the information stored in the memory, and a control circuit coupled to and operable to control the row decoder, the ramp signal generator, the comparison circuit, the counting circuit, the memory and the column read-out circuit.

DETAILED DESCRIPTION

Hereinafter, the various embodiments of the disclosed technology will be described in detail with reference to the attached drawings.

Figure 1:
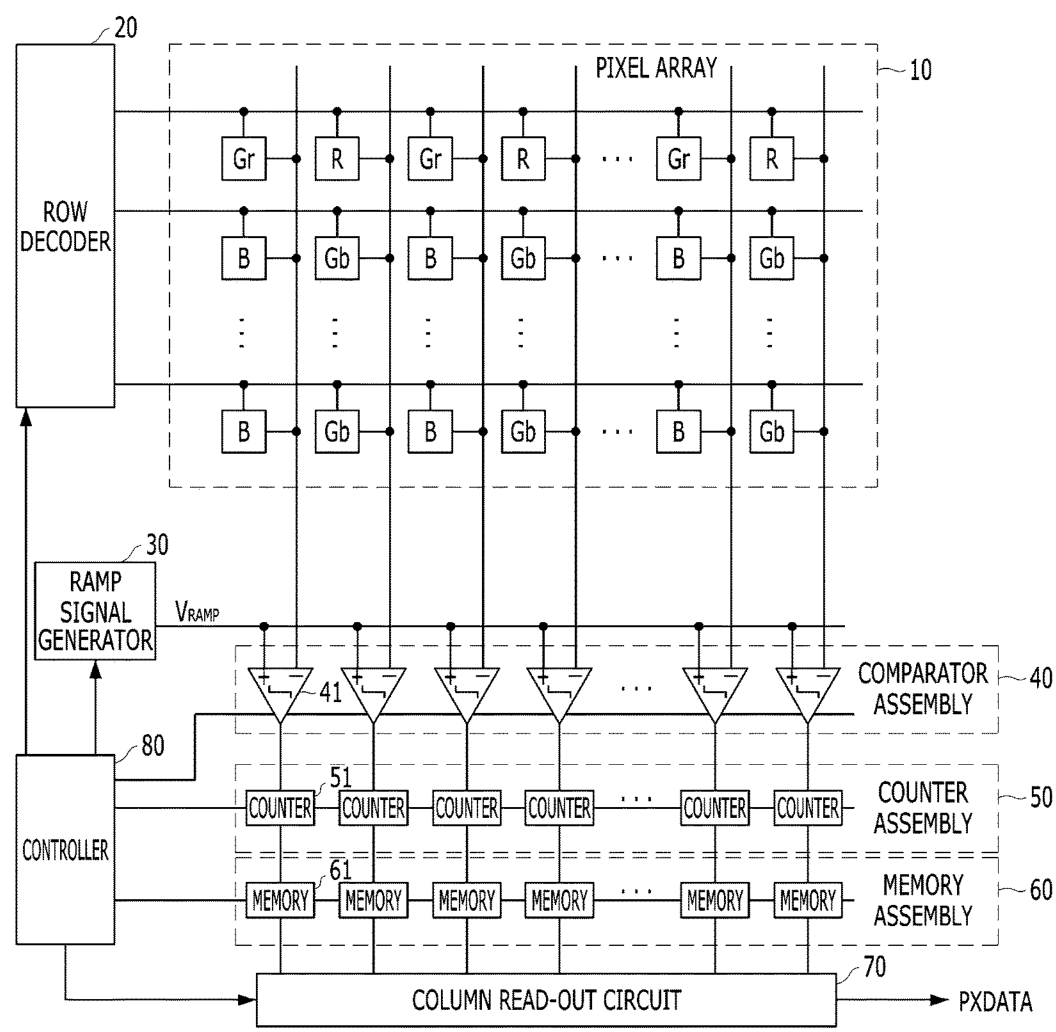
FIG. 1 is a diagram illustrating an example of a CMOS image sensor.

FIG. 1 is a diagram illustrating an example of a CMOS image sensor. The CMOS image sensor shown in FIG. 1 represents a CMOS image sensor having a column parallel structure using a single-slope analog-to-digital conversion device.

Referring to FIG. 1, the CMOS image sensor includes a pixel array 10 of imaging pixels arranged in rows and columns, a row decoder 20, a ramp signal generator 30, a comparator assembly 40, a counter assembly 50, a memory assembly 60, a column read-out circuit 70, and a controller 80. The specific example in FIG. 1 shows a pixel arrangement of colored imaging pixels labeled as "R" for a red colored pixel, "G" for a green colored pixel, "B" for a blue colored pixel, and "Gr" and "Gb" for pixels based on the well-known Bayer pattern which has 50% green pixels, 25% red pixels, and 25% blue pixels.

The pixel array 10 outputs pixel signals in response to incident light at individual imaging pixels. The row decoder 20 selects and controls pixels of the pixel array row by row. The ramp signal generation circuit 30 generates a ramp signal $V_{RAMP}$ in response to a control signal of the control circuit. The comparison circuit 40 compares the ramp signal $V_{RAMP}$ of the ramp signal generation circuit 40 with each pixel signal outputted from the pixel array.

The counting circuit 50 counts the number of clock pulses of the control circuit 80 according to output signals of the comparison circuit 40. The memory circuit 60 stores information (e.g., the number of clock pulses) provided by the counting circuit 50 according to instructions provided by the control circuit 80. The column read-out circuit 70 outputs sequentially the information stored in the memory circuit 60 as a pixel data PXDATA according to instructions provided by the control circuit 80. The control circuit 80 controls operations of the row decoder 20, the ramp signal generation circuit 30, the comparison circuit 40, the counting circuit 50, the memory circuit 60 and the column read-out circuit 70.

A CMOS image sensor may include the comparison circuit 40 that utilizes a correlated double sampling CDS technique to remove an offset value of the pixel.

The comparison circuit 40 includes a plurality of comparators 41, the counting circuit 50 includes a plurality of counters 51, and the memory circuit 60 includes a plurality of memories 61. In an example configuration, each column of the pixel array 10 includes the comparator 41, the counter 51 and the memory 61.

The operations of the comparator 41, the counter 51 and the memory 61 will be described with reference to FIG. 1 as below.

The comparator 41 has two input terminals that receive a pixel signal outputted from a column of the pixel array 10 a ramp signal $V_{RAMP}$ outputted from the ramp signal generation circuit 30, respectively. The comparator 41 compares the ramp signal $V_{RAMP}$ with the pixel signal and outputs a comparison signal in response to a control signal provided by the control circuit 80.

Since a voltage level of the ramp signal $V_{RAMP}$ increases or decreases as time passes, the ramp signal $V_{RAMP}$ crosses the pixel signal at some point in time. After this crossing point, the value of the comparison signal outputted from the comparator 41 is inverted.

The counter 51 is used to count pulses during a period of time, for example, when the pixel signal is above the ramp signal. The counter 51 is initialized by a reset control signal of the control circuit 80.

The memory 61 stores information relating to the count (e.g., number of pulses) provided by the counter 51 and outputs the information to the column read-out circuit 70 according to control signals of the control circuit 80. Here, the CMOS image sensor may perform a counting operation on a reset signal (or a reset voltage) and then perform a counting operation on an image signal (a signal voltage).

Figure 2A:
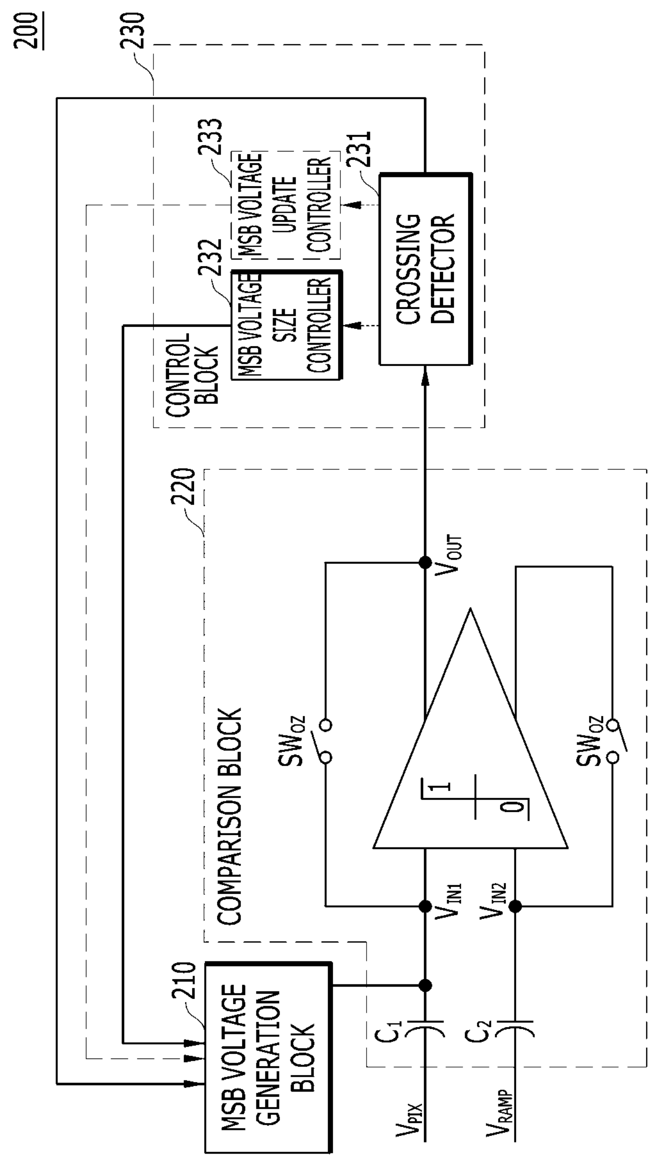
FIG. 2A is a diagram illustrating an example of a comparison device in accordance with an embodiment of the disclosed technology.

FIG. 2A is a diagram illustrating an example of a comparison device in accordance with an embodiment of the disclosed technology.

Referring to FIG. 2A, a comparison device 200 suitable for implementing an embodiment of the disclosed technology includes a most significant bit (MSB) voltage generation circuit 210, a comparison circuit 220 and a control circuit 230.

The MSB voltage generation circuit 210 has a control signal terminal to receive a MSB voltage control signal and generates an MSB voltage to modify, based on the MSB voltage control signal, a voltage level at a first input terminal $V_{IN1}$ of the comparison circuit 220 coupled to a pixel array producing a pixel signal $V_{PIX}$ and the MSB voltage generation circuit 210. The comparison circuit 220 compares an offset reference voltage with the voltage level at the first input terminal, which is obtained by adding (or subtracting) the MSB voltage to (or from) the pixel signal $V_{PIX}$. In some implementations of the disclosed technology, the MSB voltage is added to (or subtracted from) the pixel signal $V_{PIX}$ to modify the voltage at the first input terminal, and the voltage at the first input terminal is compared with the offset reference voltage to find out how many MSB voltage steps to add to (or subtract from) the pixel signal $V_{PIX}$ so that the voltage at the first input terminal can move within a desired voltage range. The comparison circuit 220 outputs an MSB comparison result signal indicating the comparison result, for example, as to whether or not the voltage at the first input terminal has reached the offset reference voltage. The comparison circuit 220 also compares a ramp signal $V_{RAMP}$ with a residue voltage, which is the resultant voltage obtained by adding (or subtracting) the MSB voltage to (or from) the pixel signal $V_{PIX}$, and outputs a least significant bit (LSB) comparison result signal.

In some implementations of the disclosed technology, the control circuit 230 includes the first input terminal, which is coupled to both the pixel array producing a pixel signal $V_{PIX}$ and the MSB voltage generation circuit 210, and a second input terminal to which the offset reference signal or the ramp signal $V_{RAMP}$ is applied. The control circuit 230 detects a crossing of the offset reference voltage and the voltage at the first input terminal $V_{IN1}$ based on the MSB comparison result signal outputted from the comparison circuit 220, and outputs the MSB voltage control signal, e.g., an MSB voltage generation control signal and an MSB voltage size control signal, to the MSB voltage generation circuit 210. Here, the crossing of the offset reference voltage and the voltage at the first input terminal $V_{IN1}$ indicates that the voltage at the first input terminal $V_{PIX}$ has reached the offset reference voltage.

More specifically, when an analog-to-digital conversion is performed on a row of the pixel array, the comparison circuit 220 compares the offset reference voltage with the voltage at the first input terminal $V_{IN1}$ while increasing (or decreasing) the voltage level at the first input terminal $V_{IN1}$ by adding (or subtracting) the MSB voltage outputted from the MSB voltage generation circuit 210 to the pixel signal $V_{PIX}$ and outputs the MSB comparison result signal. After the voltage level at the first input terminal $V_{IN1}$ has reached a desired voltage range, the comparison circuit starts to compare the ramp signal $V_{RAMP}$ of the residue voltage range with the residue voltage to output the LSB comparison result signal. In this way, the comparison circuit 220 may repeatedly perform sampling processes within the residue voltage range.

In an implementation of the disclosed technology, the comparison device 200 may be designed and operated to determine how many MSB voltage steps are to be added to (or subtracted from) the pixel signal $V_{PIX}$ to move the voltage at the first input terminal $V_{IN1}$ into the residue voltage range. One way for performing this is disclosed below as an example. The comparison circuit 220 compares the offset reference voltage with the voltage at the first input terminal $V_{IN1}$ while adding (or subtracting) the MSB voltages to (or from) the pixel signal $V_{PIX}$, and outputs the MSB comparison signal when the offset reference voltage crosses the modified voltage at the first input terminal $V_{IN1}$. The comparison device 200 modifies the voltage at the first input terminal $V_{IN1}$ based on the MSB comparison signal to generate the residue voltage, the voltage range of which is the voltage step size of the MSB voltage. Subsequently, if the comparison circuit 220 applies the residue voltage, which is increased or decreased in magnitude from the originally received pixel signal, to the comparison circuit 220 through the first input terminal $V_{IN1}$, the comparison circuit 220 compares the ramp signal $V_{RAMP}$ with the residue voltage to output the LSB comparison result signal. In an implementation of the disclosed technology, the ramp signal $V_{RAMP}$ may have the same step voltage size as the MSB voltage. In another implementation of the disclosed technology, the ramp signal $V_{RAMP}$ may have a smaller step voltage size than the MSB voltage. For example, the ramp signal $V_{RAMP}$ may have a LSB voltage size. Here, the voltage size indicates the magnitude of the voltage. In an implementation of the disclosed technology, the comparison circuit 220 receives the ramp signal $V_{RAMP}$ of the residue range from an external residue range ramp signal generator (not shown) through a second input terminal $V_{IN2}$ of the comparison circuit 220. Here, as discussed above, the residue range may be an MSB reference voltage swing range. In some implementations of the disclosed technology, the residue range may be a smaller voltage range than that of a common ramp signal.

Also, the comparison circuit 220 may include a single comparison circuit or a plurality of comparison circuits. The comparison circuit 220 may also include a first capacitor $C_1$, a second capacitor $C_2$, two switches $SW_{OZ}$ and a comparator circuit.

The control circuit 230 includes a crossing detector 231, an MSB voltage size controller 232.

The crossing detector 231 detects a crossing between two voltages input to the first and second input terminals of the comparator according to the MSB comparison result signal outputted from the comparison circuit 220, and outputs the MSB voltage generation control signal to the MSB voltage generation circuit 210. The MSB voltage size controller 232 outputs the MSB voltage size control signal to the MSB voltage generation circuit 210 according to the crossing detection result outputted from the crossing detector 231.

In another embodiment of the disclosed technology, the MSB voltage size controller 232 may be implemented to output the MSB voltage size control signal to the MSB voltage generation circuit 210 according to a control signal of an external control circuit (not shown, e.g., a timing generator).

In another embodiment of the disclosed technology, the control circuit 230 may further include an MSB voltage update controller 233 for outputting an MSB voltage update control signal to the MSB voltage generation circuit 210 according to the crossing detection result. In another embodiment of the disclosed technology, the MSB voltage update controller 233 may be implemented to output the MSB voltage update control signal to the MSB voltage generation circuit 210 according to the control signal of the external control circuit (not shown, e.g., a timing generator). The MSB voltage update controller 233 may update the MSB voltage value through the MSB voltage generation circuit 210 for each MSB voltage application when the residue voltage value is multi-sampled.

Figure 2B:
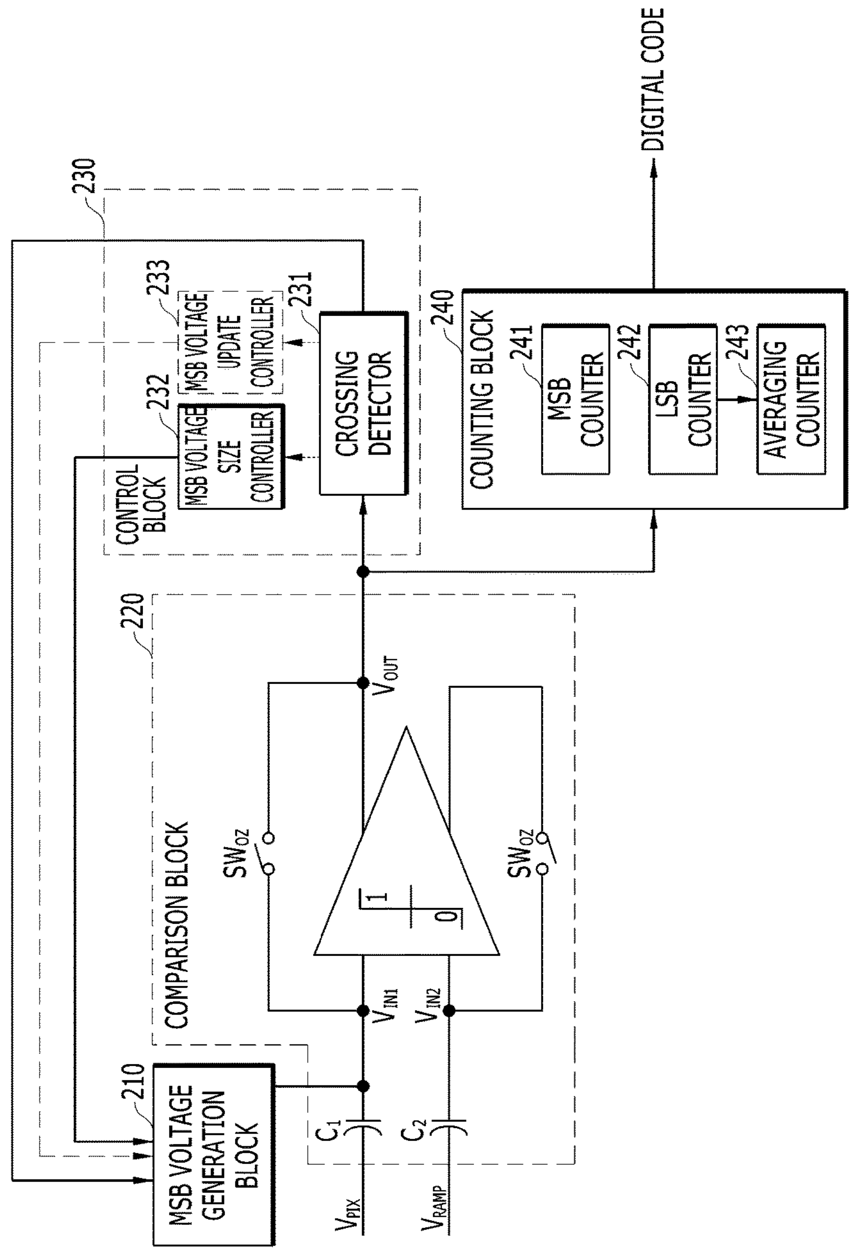
FIG. 2B is a diagram illustrating an example of an analog-to-digital conversion device including the comparison device shown in FIG. 2A in accordance with an embodiment of the disclosed technology.

FIG. 2B is a diagram illustrating an example of an analog-to-digital conversion device including the comparison device shown in FIG. 2A in accordance with an embodiment of the disclosed technology.

Referring to FIG. 2B, an analog-to-digital conversion device in accordance with an embodiment of the disclosed technology includes an MSB voltage generation circuit 210, a comparison circuit 220, a control circuit 230 and a counting circuit 240.

Since the MSB voltage generation circuit 210, the comparison circuit 220 and the control circuit 230 shown in FIG. 2B may be implemented in the same way as the MSB voltage generation circuit 210, the comparison circuit 220 and the control circuit 230 shown in FIG. 2A, the detailed descriptions of the MSB voltage generation circuit 210, the comparison circuit 220 and the control circuit 230 will be omitted.

The counting circuit 240 performs an MSB counting operation according to the MSB comparison result signal outputted form the comparison circuit 220 to determine how many MSB voltage steps are to be added to (or subtract from) the originally received pixel signal so that a wave pattern that has the same wave pattern as the pixel signal moves within a desired voltage range such as the residue voltage range. Once the voltage at the first input terminal $V_{IN1}$ has reached the residue voltage range by adding (or subtracting) MSB voltage steps to (or from) the originally received pixel signal, the counting circuit 240 performs an LSB counting operation according to the LSB comparison result signal outputted from the comparison circuit 220. In an implementation of the disclosed technology, the counting circuit 240 may perform an averaging operation on the comparison result signal.

In an implementation of the disclosed technology, the counting circuit 240 includes an MSB counter 241, an LSB counter 242, and a counter 243 such as an averaging counter.

The MSB counter 241 performs the MSB counting operation based on the MSB comparison result signal outputted from the comparison circuit 220 and outputs an MSB code.

For example, the MSB code may contain information as to whether the pixel signal has reached the desired voltage range. The LSB counter 242 performs the LSB counting operation based on the LSB comparison result signal outputted from the comparison circuit 220, and outputs LSB codes. For example, the LSB code may be the digital code into which the pixel signal is translated. The counter 243 averages the LSB codes outputted from the LSB counter 242, and outputs an averaged LSB code value.

The MSB counter 241, the LSB counter 242 and the counter 243 may be implemented using any type of counter circuit that is capable of producing binary count information based on it input signal. In an example implementation of the disclosed technology, the counter 243 may be an averaging counter that performs counting and averaging on the comparison signal.

Figure 2C:
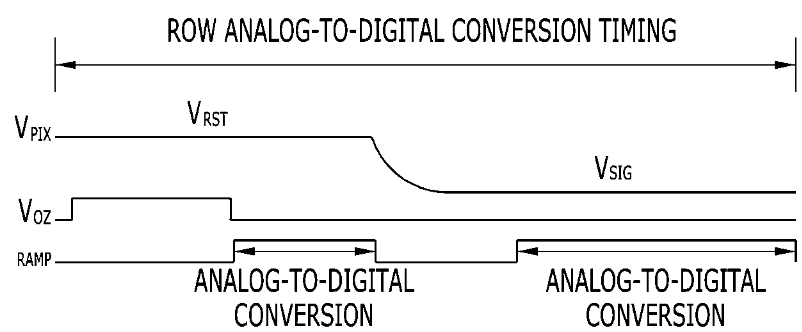
FIG. 2C is a timing diagram illustrating an example of an analog-to-digital conversion of the comparison device shown in FIG. 2A and the analog-to-digital conversion device shown in FIG. 2B.

FIG. 2C is a diagram illustrating an example of an analog-to-digital conversion of the comparison device shown in FIG. 2A and the analog-to-digital conversion device shown in FIG. 2B.

The pixel signal $V_{PIX}$ is a signal outputted from a pixel and includes a reset signal $V_{RST}$ and a signal voltage $V_{SIG}$. In performing the analog-to-digital conversion, a correlated double sampling (CDS) is often used to eliminate some unwanted noise. In the CDS, a reset signal $V_{RST}$ is output first, and then a signal voltage $V_{SIG}$ is output.

The comparison device 200 acquires a difference value ($|V_{RST}-V_{SIG}|$) between the reset signal $V_{RST}$ and the signal voltage $V_{SIG}$ through the CDS operation and determines the acquired difference value as the value of the pixel signal.

The analog-to-digital conversion device converts the determined analog pixel signal to a digital value. This CDS operation is often called an analog CDS operation.

The CDS operation includes two sets of sampling and holding that are sequentially performed. The reset voltage $V_{RST}$ is sampled and held in the first capacitor $C_1$, and then the signal voltage $V_{SIG}$ is sampled and held in the first capacitor $C_1$. Subsequently, the analog-to-digital-converting operation is performed to obtain a digital code value based on an absolute value of the reset signal $V_{RST}$, and to obtain a digital code value based on the difference value ($|V_{RST}-V_{SIG}|$1) between the reset signal $V_{RST}$ and the signal voltage $V_{SIG}$. Thus, an analog-to-digital conversion efficiency may be improved by removing an unwanted offset, which is caused by the analog-to-digital conversion, through the performing of the above-described CDS operation.

More specifically, referring to FIGS. 2B and 2C, when the reset voltage $V_{RST}$ is outputted from the pixel, the two switches $SW_{OZ}$ are switched on according to the control signal of the control circuit (not shown), and a reset voltage value is sampled and held in the first capacitor $C_1$. A voltage at a first input voltage node $V_{IN1}$ becomes $-(V_{RST}-V_{CO})$, and a second input voltage $V_{IN2}$ becomes $V_{CO}$, where $V_{CO}$ denotes an MSB voltage caused by circuitry in the comparator.

Subsequently, the two switches $SW_{OZ}$ are switched off and the ramp signal $V_{RAMP}$ is applied to the second input voltage node $V_{IN2}$ through the second capacitor $C_2$, and then the comparator compares the first input voltage $V_{IN1}$ with the second input voltage $V_{IN2}$, and outputs the comparison result. The analog-to-digital conversion for the reset voltage $V_{RST}$ is performed according to the comparison result signal.

Next, the signal voltage $V_{SIG}$ of the pixel signal is applied to the comparator through the first capacitor $C_1$, and a voltage at the first input voltage node $V_{IN1}$ becomes $V_{SIG}-V_{RST}+V_{CO}$ and a voltage at the second input voltage node $V_{IN2}$ becomes $V_{CO}$. The voltage difference between the first input voltage node $V_{IN1}$ and the second input voltage node $V_{IN2}$ becomes $V_{SIG}-V_{RST}$, and the analog CDS operation may be performed through the above-described process.

Subsequently, by performing analog-to-digital-conversion on the difference value ($|V_{RST}-V_{SIG}|$) between the reset voltage $V_{RST}$ and the signal voltage $V_{SIG}$, a corresponding digital code value is acquired, and by subtracting the analog-to-digital conversion code value of the reset voltage $V_{RST}$, the digital CDS operation is performed. Thus, analog-to-digital conversion performance may be improved through the above-described process.

Figure 2D:
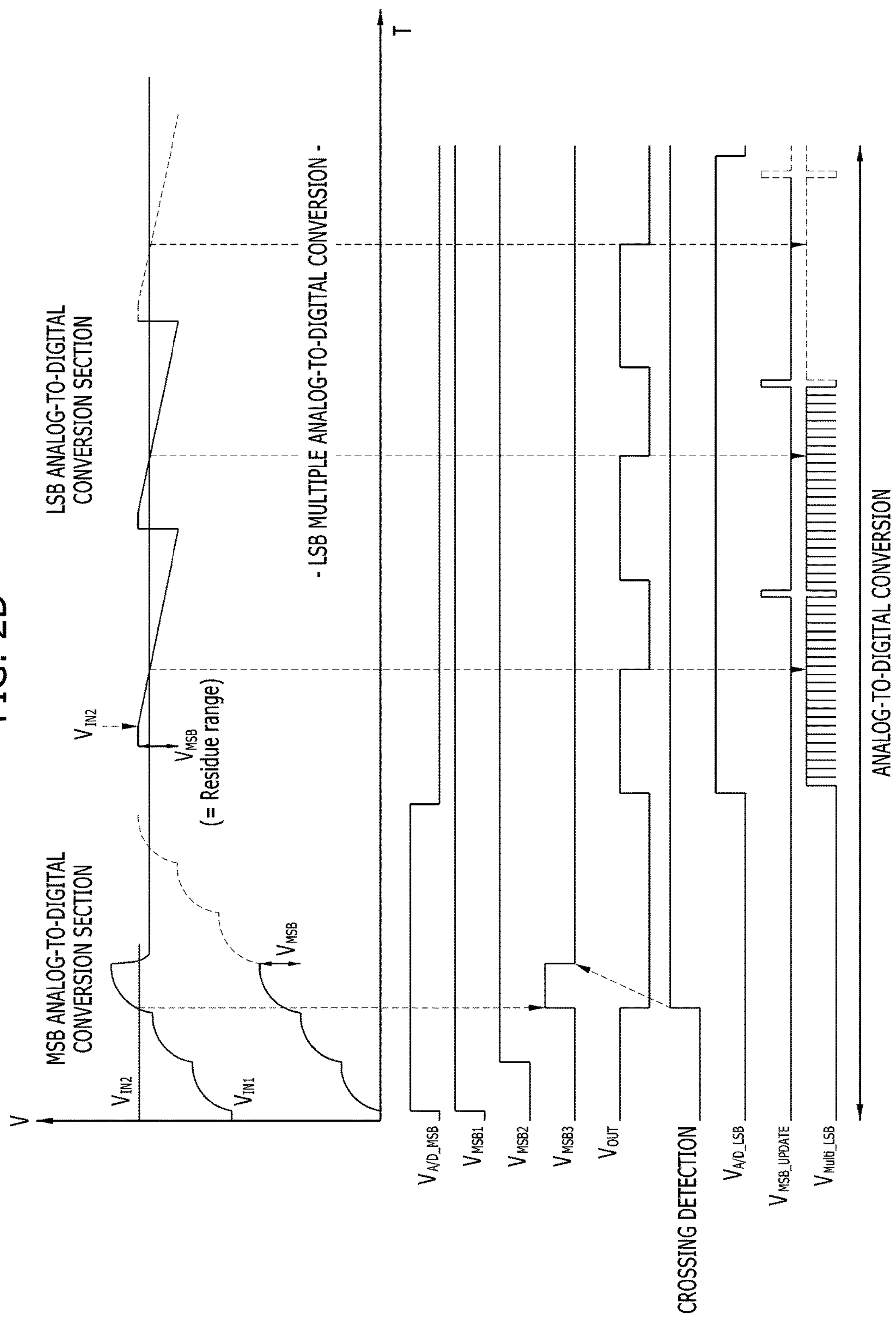
FIG. 2D is a timing diagram illustrating the comparison device shown in FIG. 2A and the analog-to-digital conversion device shown in FIG. 2B.

FIG. 2D is a timing diagram illustrating, among other, an example of the first input voltage $V_{IN1}$ and the second input voltage $V_{IN2}$ of the comparison device shown in FIG. 2A and the analog-to-digital conversion device shown in FIG. 2B.

Referring to FIG. 2D, an analog-to-digital conversion implemented based on the disclosed technology includes an MSB analog-to-digital conversion section and an LSB analog-to-digital conversion section.

In the MSB analog-to-digital conversion section, an analog-to-digital conversion operation is performed based on the voltage at the first input terminal $V_{IN1}$ increased by the MSB voltage steps in response to the MSB voltage generation control signals $V_{MSB1}$, $V_{MSB2}$, . . . $V_{MSBn}$.

Here, each increase in the magnitude of the voltage at the first input terminal $V_{IN1}$ occurs in response to each of the MSB voltage generation control signals $V_{MSBn}$ (e.g., rising edge of each MSB voltage generation control signal as in FIG. 2D), which is inputted from the crossing detector 231 to the MSB voltage generation circuit 210. The MSB voltage is applied to the input terminal of the first input voltage $V_{IN1}$ until the first input voltage $V_{IN1}$ crosses the second input voltage $V_{IN2}$, and an output of the comparison circuit causes the crossing detector 231 to operates. The reference character "n" in the $V_{MSBn}$ is a natural number indicating the number of MSB voltage steps or the MSB timing number. For example, "n" represents VFULL/VMSB, where "$V_{FULL}$" represents a full reference swing range and "$V_{MSB}$" represents the MSB reference swing range.

In the LSB analog-to-digital conversion section after the MSB analog-to-digital conversion operation, the LSB analog-to-digital conversion operation is performed according to the LSB conversion voltage $V_{A/D\_LSB}$.

More specifically, the first input voltage VIN1 is modified based on the MSB voltage. For example, if the first input voltage VIN1 is modified to decrease its voltage level, the first input voltage $V_{IN1}$ would be $V_{PIX}-V_{MSB1}$, $V_{PIX}-V_{MSB2}$, . . . $V_{PIX}-V_{MSBn}$, and each decrease occurs according to the operation timing of the MSB voltage generation control signal $V_{MSBn}$. If the first input voltage VIN1 is modified to increase its voltage level, the first input voltage VIN1 would be $V_{PIX}+V_{MSB1}$, $V_{PIX}+V_{MSB2}$, . . . $V_{PIX}+$ $V_{MSBn}$, and each increase occurs according to the operation timing of the MSB voltage generation control signal $V_{MSBn}$. Here, if the first input voltage VIN1 crosses the second input voltage VIN2 at $n^{th}$ timing of the MSB analog-to-digital conversion section, the crossing detector 231 detects the voltage crossing through the MSB comparison result signal outputted from the comparison circuit. Thus, the crossing detector 231 transfers the MSB voltage generation control signal $V_{MSBn}$ to the MSB voltage generation circuit 210. The MSB voltage controller 211 of the MSB voltage generation circuit 210 illustrated in FIGS. 3A and 3B holds the MSB voltage generation control signal $V_{MSBn}$ at an $n^{th}$ latch, and the modified pixel signal is applied as the residue voltage (i.e., voltage within the residue range) to the node of the first input voltage $V_{IN1}$.

Here, in the MSB analog-to-digital conversion section, the MSB counter 241 counts to find out the crossing timing between the first input voltage $V_{IN1}$ and the second input voltage $V_{IN2}$, and outputs an MSB code. The MSB code is a digital code value.

In another embodiment of the disclosed technology, the MSB code value that has been obtained from a previous process may be stored and used in a subsequent analog-to-digital conversion to prevent a distortion of the MSB information and improve linearity by generating and refreshing an analog MSB voltage corresponding to the MSB information based on the previously stored MSB code value at every predetermined timing during the LSB conversion operation. The above-described process may be implemented according to the timing of an MSB update control signal $V_{MSB\text{-}UPDATE}$ by adding the MSB voltage update controller 233 and the MSB voltage updater 214 illustrated in FIG. 3A.

Since the residue voltage applied to the input node of the first input voltage $V_{IN1}$ has a voltage falling within the residue range, the LSB analog-to-digital conversion operation can be performed using the ramp signal having the residue range, which is applied from the residue range ramp signal generator (not shown) to the node of the second input voltage $V_{IN2}$. As shown in FIGS. 2B and 2D, the LSB count values may be acquired by counting until the crossing point between the ramp signal having the residue range and the residue voltage. The LSB count values represent digital code obtained by sampling the residue voltage multiple times. Each of the LSB count values is averaged by the counter 243 to benefit from a noise-averaging effect and is outputted as an LSB code value to a memory. The analog-to-digital conversion value of the pixel signal $V_{PIX}$ may be acquired by calculating the MSB code value and the LSB code value in the CMOS image sensor. Also, in removing a noise from the pixel signal at a low illuminance, various implementations of the disclosed technology may reduce power consumption by sampling the pixel signal multiple times within a confined voltage range.

Figure 3A:
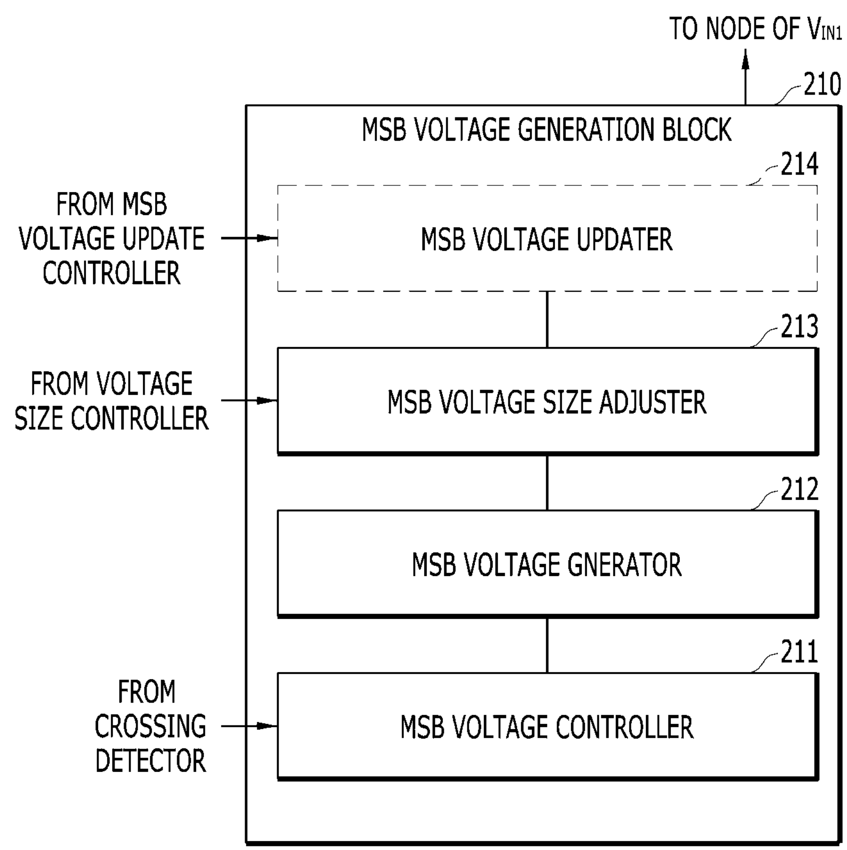
FIG. 3A is a diagram illustrating an example of the MSB voltage generation circuit shown in FIGS. 2A and 2B.
Figure 3B:
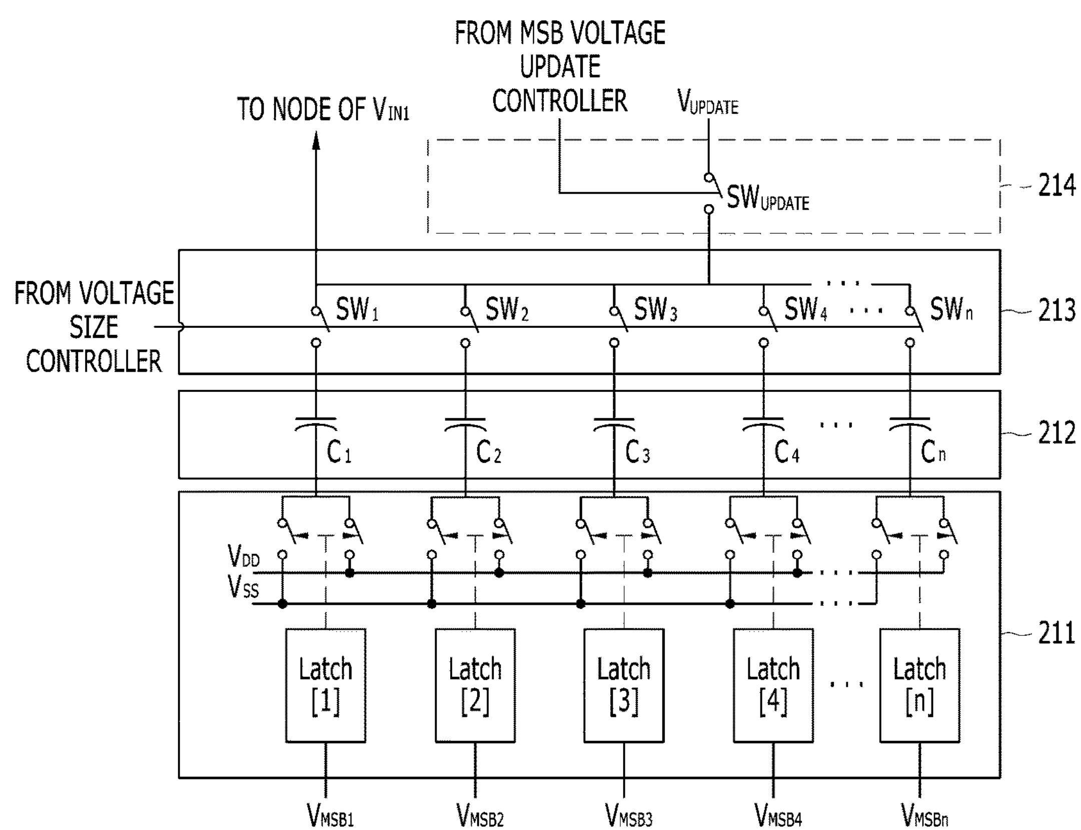
FIG. 3B is a diagram illustrating an example of the MSB voltage generation circuit shown in FIG. 3A.

FIG. 3A a diagram illustrating an example of the MSB voltage generation circuit shown in FIGS. 2A and 2B. FIG. 3B is a diagram illustrating an example of the MSB voltage generation circuit shown in FIG. 3A.

Referring to FIG. 3A, the MSB voltage generation circuit 210 includes an MSB voltage size adjuster 213, an MSB voltage generator 212 and an MSB voltage controller 211.

The MSB voltage size adjuster 213 adjusts an MSB voltage size according to the MSB voltage size control signal outputted from the MSB voltage size controller 232 illustrated in FIGS. 2A and 2B. The MSB voltage generator 212 generates the MSB voltage of which the magnitude is adjusted by the MSB voltage size adjuster 213, according to control commands of the MSB voltage controller 211. The MSB voltage controller 211 controls the MSB voltage generation (e.g., holding the MSB voltage in the latch at $(n-1)^{th}$ timing) according to the MSB voltage generation control signal outputted from the crossing detector 231 of the control circuit 230 indicated by FIGS. 2A and 2B.

The MSB voltage generation circuit 210 may further include an MSB voltage updater 214 for updating the MSB voltage generated from the MSB voltage generator 212 according to the MSB update control signal $V_{MSB\text{-}UPDATE}$ outputted from the MSB voltage update controller 233 of the control circuit 230 illustrated in FIGS. 2A and 2B.

More specifically, referring to FIG. 3B, the MSB voltage size adjuster 213 may be implemented using a plurality switches $SW_1$ to $S_{Wn}$. The magnitude of the MSB voltage is determined by the number of turned-on switches. For example, if a first switch $SW_1$, a second switch $SW_2$ and a third switch $SW_3$ are switched on, a first capacitor $C_1$, a second capacitor $C_2$ and a third capacitor $C_3$ included in the MSB voltage generator 212 are operated. In this scenario, a voltage range between a power supply voltage $V_{DD}$ and a ground voltage $V_{SS}$ is divided into three sub-ranges to generate the MSB voltage.

If the first switch $SW_1$, the second switch $SW_2$, the third switch $SW_3$ and a fourth switch $SW_4$ are switched on, the first capacitor $C_1$, the second capacitor $C_2$, the third capacitor $C_3$ and a fourth capacitor $C_4$ included in the MSB voltage generator 212 are operated. In this scenario, the voltage range between the power supply voltage $V_{DD}$ and the ground voltage $V_{SS}$ is divided into four sub-range units of 1/4, and to generate the MSB voltage.

Here, the MSB voltage controller 211 includes a plurality of latches Latch [l] to Latch [n] for receiving the MSB voltage generation control signal from the crossing detector 231 indicated by FIGS. 2A and 2B, and a plurality of switches for switching between the power supply voltage $V_{DD}$ and the ground voltage $V_{SS}$ according to the output signals of the plurality of latches Latch [l] to Latch [n]. The power supply voltage $V_{DD}$ and the ground voltage $V_{SS}$ may be adjusted by an external control circuit (not shown). The size of the MSB voltage may be adjusted according to the control of the MSB voltage controller 211. The plurality of latches Latch [l] to Latch [n] operate according to the MSB voltage generation control signal $V_{MSB}$. The number of the plurality of latches Latch [l] to Latch [n] correspond to the number of the applied MSB voltage. The size of the MSB voltage and the number of the applied MSB voltage may be selectively adjusted.

The MSB voltage updater 214 may be implemented using a fifth switch $SW_{UPDATE}$. As the fifth switch $SW_{UPDATE}$ is switched on, an update voltage $V_{UPDATE}$ is applied to the capacitor $C_n$ included in the MSB voltage generator 212 through the MSB voltage size adjuster 213 and resets the charge on the capacitor $C_n$. If the initial voltage is the power supply voltage $V_{DD}$, the update voltage $V_{UPDATE}$ may be the power supply voltage $V_{DD}$, and if the initial voltage is the ground voltage, the update voltage $V_{UPDATE}$ may be the ground voltage $V_{SS}$.

An update timing may occur before the MSB analog-to-digital conversion operation, or between the MSB analog-to-digital conversion operation and the timing of a first MSB voltage generation control signal $V_{MSB1}$. Also, the update timing may occur before the timing of the MSB update control signal $V_{MSB\text{-}UPDATE}$, or in synchronization with the timing of the MSB update control signal $V_{MSB\text{-}UPDATE}$.

Figure 4A:
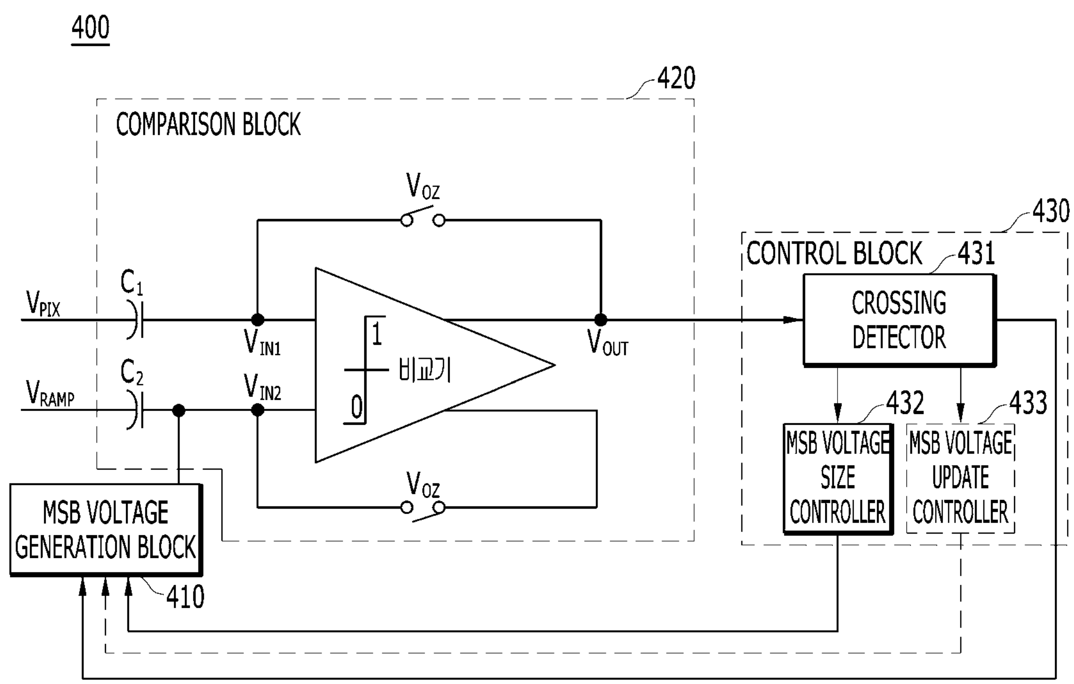
FIG. 4A is a diagram illustrating an example of a comparison device in accordance with another embodiment of the disclosed technology.

FIG. 4A is a diagram illustrating an example of a comparison device in accordance with another embodiment of the disclosed technology.

Referring to FIG. 4A, the comparison device 400 in accordance with another embodiment of the disclosed technology includes an MSB voltage generation circuit 410, a comparison circuit 420 and a control circuit 430.

The MSB voltage generation circuit 410 generates an MSB voltage to modify a voltage level of a reference voltage (e.g., ramp signal) according to an MSB voltage control signal. The comparison circuit 420 compares a pixel signal $V_{PIX}$ with a ramp signal that can be increased or decreased by the MSB voltage outputted from the MSB voltage generation circuit 410, and outputs an MSB comparison result signal. The comparison circuit 420 compares a ramp signal $V_{RAMP}$ with a residue voltage, which represents a difference between the pixel signal and the MSB voltage, and outputs an LSB comparison result signal.

The control circuit 430 detects a crossing of the pixel signal and the reference signal based on the comparison result signal outputted from the comparison circuit 420, and outputs the MSB voltage control signal, e.g., an MSB voltage generation control signal and an MSB voltage size control signal, to the MSB voltage generation circuit 410.

More specifically, when an analog-to-digital conversion is performed on a row of the pixel array, the comparison circuit 420 compares a pixel signal $V_{PIX}$ with the offset reference voltage that has been increased (or decrease) by the MSB voltage outputted from the MSB voltage generation circuit and outputs the MSB comparison result signal. After the offset reference voltage is moved to a voltage range of the pixel signal $V_{PIX}$ by increasing (or decreasing) the voltage level of the offset reference voltage, the comparison circuit starts to compare the pixel signal $V_{PIX}$ with the residue voltage and outputs the LSB comparison result signal. In this way, the comparison circuit 420 may repeatedly perform sampling processes within the residue voltage range. Here, the residue voltage represents a voltage difference between the ramp signal $V_{RAMP}$ and the MSB voltage.

Also, the comparison circuit 420 may include a single comparison circuit or a plurality of comparison circuits. In an implementation of the disclosed technology, the comparison circuit 420 includes a first capacitor $C_1$, a second capacitor $C_2$, two switches $SW_{OZ}$ and a comparator.

The control circuit 430 includes a crossing detector 431, and an MSB voltage size controller 432.

The crossing detector 431 detects a crossing of between two voltages input to the first and second input terminals the comparator according to the MSB comparison result signal outputted from the comparison circuit 420, and outputs the MSB voltage generation control signal to the MSB voltage generation circuit 410. The MSB voltage size controller 432 outputs the MSB voltage size control signal to the MSB voltage generation circuit 410 according to the crossing detection result outputted from the crossing detector 431.

Here, the MSB voltage size controller 432 may be implemented to output the MSB voltage size control signal to the MSB voltage generation circuit 410 according to a control signal of the control circuit (not shown, e.g., a timing generator) in another embodiment.

Also, the control circuit 430 may further include an MSB voltage update controller 433 for outputting an MSB voltage update control signal to the MSB voltage generation circuit 410 according to the crossing detection result outputted from the crossing detector 431. In another embodiment, the MSB voltage update controller 433 may be implemented to output the MSB voltage update control signal to the MSB voltage generation circuit 410 according to the control signal of the external control circuit (not shown, e.g., a timing generator).

In an implementation of the disclosed technology, the MSB voltage generation circuit 410 may be implemented in the same way as the MSB voltage generation circuit 210 shown in FIGS. 3A and 3B except that the MSB voltage is applied to the node of the second input voltage $V_{IN2}$.

Figure 4B:
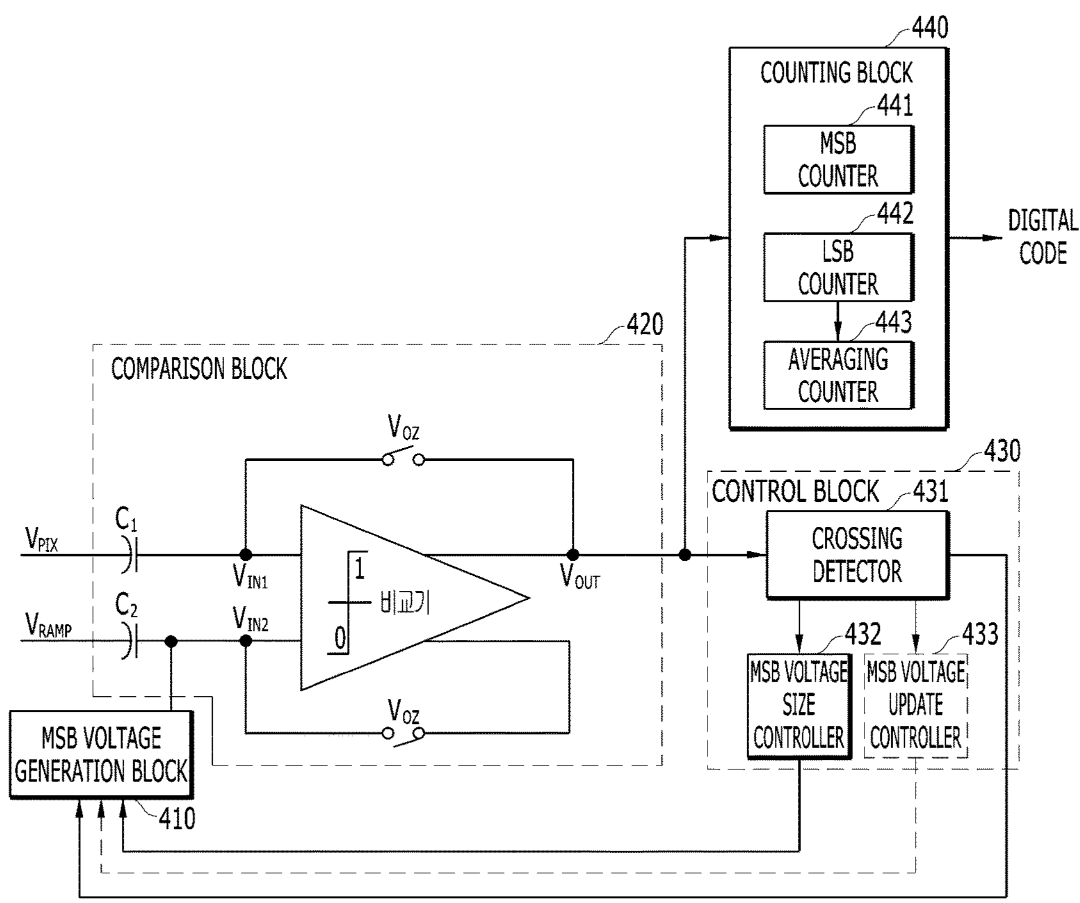
FIG. 4B is a diagram illustrating an example of an analog-to-digital conversion device including the comparison device shown in FIG. 4A in accordance with another embodiment of the disclosed technology.

FIG. 4B is a diagram illustrating an example of an analog-to-digital conversion device including the comparison device shown in FIG. 4A in accordance with another embodiment of the disclosed technology.

Referring to FIG. 4B, an analog-to-digital conversion device in accordance with another embodiment of the disclosed technology includes an MSB voltage generation circuit 410, a comparison circuit 420, a control circuit 430 and a counting circuit 440.

In an implementation of the disclosed technology, the MSB voltage generation circuit 410, the comparison circuit 420 and the control circuit 430 shown in FIG. 4B may be implemented in the same way as the MSB voltage generation circuit 410, the comparison circuit 420 and the control circuit 430 shown in FIG. 4A.

The counting circuit 440 performs an MSB counting operation according to the MSB comparison result signal outputted form the comparison circuit 420, performs an LSB counting operation according to the LSB comparison result signal outputted from the comparison circuit 420 and performs an averaging operation.

The counting circuit 440 includes an MSB counter 441, an LSB counter 442 and an counter 443. In an example implementation of the disclosed technology, the counter 443 may be an averaging counter that performs counting and averaging on the comparison signal.

The MSB counter 441 performs the MSB counting operation based on the MSB comparison result signal outputted from the comparison circuit 420 and outputs an MSB code. The LSB counter 442 performs the LSB counting operation based on the LSB comparison result signal outputted from the comparison circuit 420, and outputs LSB codes. The counter 443 may counting and averaging on the LSB codes outputted from the LSB counter 442, and outputs an averaged LSB code value.

Since the MSB counter 441, the LSB counter 442 and the averaging counter 443 may be implemented in the same way as those counters discussed above.

Figure 4C:
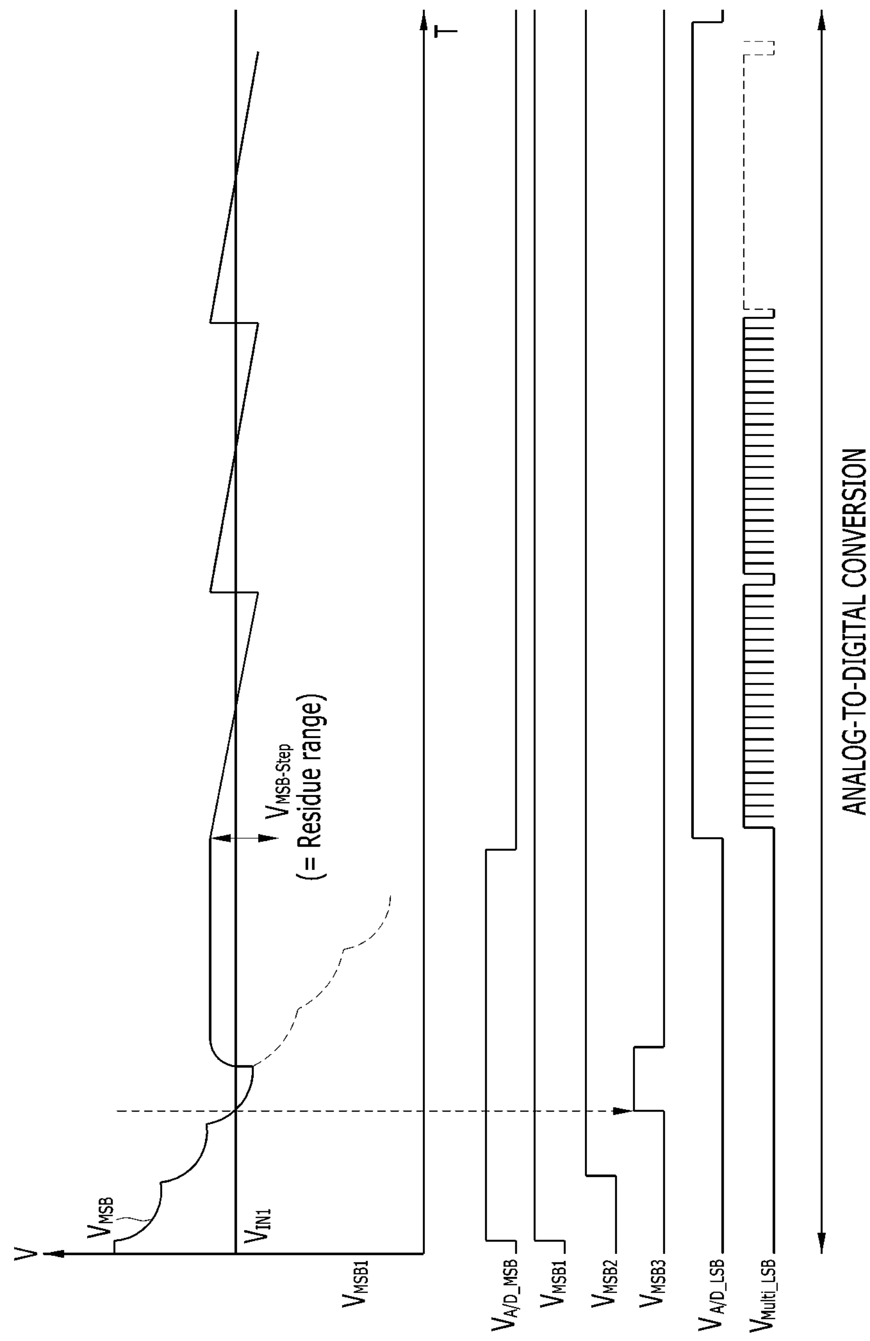
FIG. 4C is a timing diagram illustrating a timing of the comparison device shown in FIG. 4A and the analog-to-digital conversion device shown in FIG. 4B.

FIG. 4C is a timing diagram illustrating, among other, an example of the first input voltage $V_{IN1}$ and the second input voltage $V_{IN2}$ of the comparison device shown in FIG. 4A and the analog-to-digital conversion device shown in FIG. 4B.

The timing diagram shown in FIG. 4C is the same as the timing diagram shown in FIG. 2D except the first input voltage $V_{IN1}$ and the second input voltage $V_{IN2}$.

Since the timing of the first input voltage $V_{IN1}$ and the second input voltage $V_{IN2}$ shown in FIG. 4C is similar to the timing of the first input voltage $V_{IN1}$ and the second input voltage $V_{IN2}$ shown in FIG. 2D, the detailed descriptions of the crossing timing of the first input voltage $V_{IN1}$ and the second input voltage $V_{IN2}$ will be omitted.

Referring to FIG. 4C, the first input voltage $V_{IN1}$ has a constant voltage level, and the waveform of the second input voltage $V_{IN2}$, which is a reference voltage, is adjusted by the MSB voltage outputted from the MSB voltage generation circuit 410.

In another embodiment of the disclosed technology, a gain error that occurs by adding a capacitor to an input terminal may be removed by adding a redundancy, e.g., setting mismatched value as an MSB voltage value and removing the set mismatched value after operation is performed. Also, this gain error may be removed by adding a dummy capacitance having the same size as the added capacitance to different input terminal.

Figure 5:
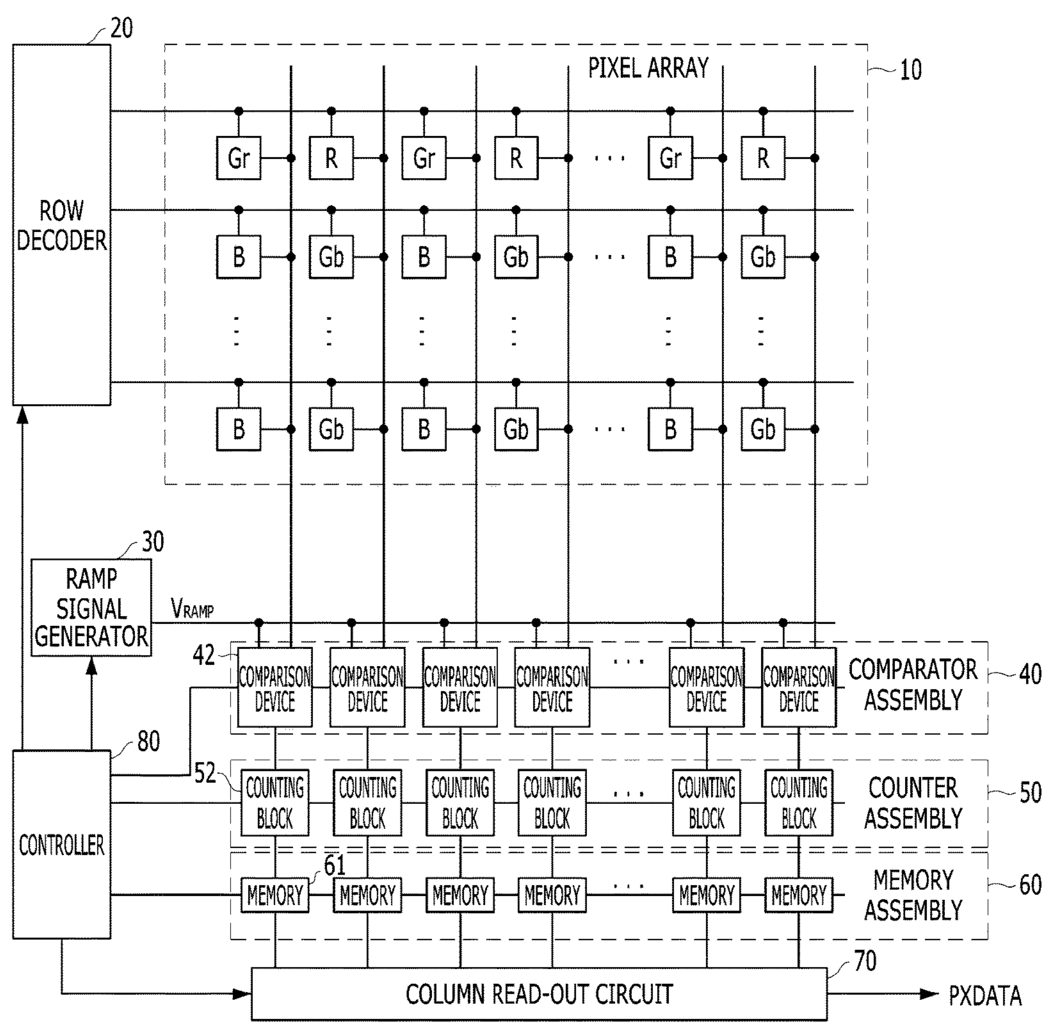
FIG. 5 is a diagram illustrating an example of a CMOS image sensor in accordance with embodiments of the disclosed technology.

FIG. 5 is a diagram illustrating an example of a CMOS image sensor including a comparison device in accordance with embodiments of the disclosed technology.

Referring to FIG. 5, the CMOS image sensor in accordance with certain embodiments of the disclosed technology includes a pixel array 10, a row decoder 20, a ramp signal generator 30, a comparator assembly 40, a counter assembly 50, a memory assembly 60, a column read-out circuit 70, and a controller 80.

The pixel array 10 outputs a pixel signal corresponding to incident light. The row decoder 20 selects and controls pixels of the pixel array row by row. The ramp signal generator 30 generates a ramp signal $V_{RAMP}$ (including a coarse ramping signal and a fine ramping signal) having a residue range in response to a control signal of the controller 80. The comparator assembly 40 compares the ramp signal $V_{RAMP}$ of the ramp signal generator 30 with each pixel signal outputted from the pixel array.

The counter assembly 50 counts the number of clock pluses of the controller 80 according to an output signal of the comparator assembly 40. The memory assembly 60 stores information (e.g., the number of clock pulses) provided by the counter assembly 50 according to instructions provided by the controller 80. The column read-out circuit 70 outputs sequentially the information stored in the memory assembly 60 as a pixel data PXDATA according to instructions provided by the controller 80. The controller 80 controls operations of the row decoder 20, the ramp signal generator 30, the comparator assembly 40, the counter assembly 50, the memory assembly 60, and the column read-out circuit 70.

Here, the comparator assembly 40 includes the comparison device 42, which is implemented using the comparison device 200 shown in FIG. 2A or the comparison device 400 shown in FIG. 4A in accordance with embodiments of the disclosed technology.

Also, the counter assembly 50 includes the counting circuit 52, which is implemented using the counting circuit 240 shown in FIG. 2B or the counting circuit 440 shown in FIG. 4B in accordance with embodiments of the disclosed technology.

The single-slope analog-to-digital conversion technique implemented based on the disclosed technology may exhibit a multi-sampling effect without the increase in the number of clocks.

That is, a multi-sampling effect may be acquired by analog-to-digital-converting an input signal multi times through the LSB step.

Also, since it is important for the pixel signal to remove a noise at a low illuminance, various embodiments of the disclosed technology are especially beneficial in removing unwanted noise in the low illuminance condition, and a noise removing performance of the disclosed analog-to-digital conversion may be improved without the increase in an operation time and a power consumption.

Although various embodiments and specific examples have been described various changes and modifications may be made based on what is described and illustrated.

What is claimed is:

1. A comparison device, comprising:

a most significant bit (MSB) voltage generation circuit that includes a control signal terminal to receive an MSB voltage control signal and is structured to generate an MSB voltage;

a comparison circuit including a first input terminal coupled to receive a first input signal and a second input terminal coupled to receive a second input signal that is modified by the MSB voltage outputted from the MSB voltage generation circuit to output an MSB comparison result signal, the comparison circuit comparing the first input signal with a residue voltage and outputting a least significant bit (LSB) comparison result signal; and a control circuit coupled to the comparison circuit to receive the comparison signal and operable to detect a crossing of the first input signal and the second input signal according to the MSB comparison result signal and to output the MSB voltage control signal to the MSB voltage generation circuit.

2. The comparison device of claim 1, wherein comparison circuit moves the first input signal to a desired voltage range by comparing the first input signal with the modified second input signal, and, after the first input signal has reached the desired voltage range, the comparison circuit compares the first input signal with a residue voltage and outputs the LSB comparison result signal.

3. The comparison device of claim 1, wherein the comparison circuit repeatedly performs a comparison process multiple times during an analog-to-digital conversion, and wherein the comparison process compares the first input signal with the modified second input signal by the MSB voltage to find out how many MSB voltage steps are needed for the first input signal to move to the desired voltage range and produces the MSB comparison result signal at an initial time, and after the initial time, compares the first input signal of a residue range with the residue voltage to output the LSB comparison result signal.

4. The comparison device of claim 1, wherein the control circuit includes:

a crossing detector structured to detect a crossing of the first input signal and the second input signal according to the MSB comparison result signal outputted from the comparison circuit to produce an output indicating a detection result of the crossing and to output an MSB voltage generation control signal to the MSB voltage generation circuit; and an MSB voltage size controller coupled to the crossing detector to receive the output thereof and operable to output an MSB voltage size control signal to the MSB voltage generation circuit according to a crossing detection result outputted from the crossing detector.

5. The comparison device of claim 4, wherein the control circuit further includes:

an MSB voltage update controller coupled to the MSB voltage generation circuit to output an MSB voltage update control signal to the MSB voltage generation circuit.

6. The comparison device of claim 1, wherein the MSB voltage generation circuit includes:

an MSB voltage size adjuster coupled to the control circuit to receive the MSB voltage size control signal to adjust a magnitude of the MSB voltage;

an MSB voltage controller coupled to the control circuit to receive the MSB voltage generation control signal to control the generation of the MSB voltage; and an MSB voltage generator coupled to the MSB voltage size adjuster and the MSB voltage controller to generate the MSB voltage of which the size is adjusted by the MSB voltage size adjuster according to the control of the MSB voltage controller.

7. The comparison device of claim 6, wherein the MSB voltage generation circuit further includes:

an MSB voltage updater coupled to the MSB voltage size adjuster to update the MSB voltage outputted from the MSB voltage generator according to an MSB voltage update control signal outputted from the control circuit.

8. The comparison device of claim 1, wherein the first input signal is a pixel signal and the second input signal is an offset reference voltage.

9. The comparison device of claim 1, wherein the first input signal is an offset reference voltage or a ramp signal and the second input signal is obtained by adding or subtracting the MSB voltage to or from a pixel signal.

10. An analog-to-digital conversion device, comprising:

a most significant bit (MSB) voltage generation circuit that includes a control signal terminal to receive an MSB voltage control signal and is structured to generate an MSB voltage;

a comparison circuit including a first input terminal coupled to receive a first input signal and a second input terminal coupled to receive a second input signal that is modified by the MSB voltage outputted from the MSB voltage generation circuit to output an MSB comparison result signal, the comparison circuit comparing the first input signal with a residue voltage and outputting a least significant bit (LSB) comparison result signal;

a control circuit coupled to the comparison circuit to receive the comparison signal and operable to detect a crossing of the first input signal and the second input signal according to the MSB comparison result signal and to output the MSB voltage control signal to the MSB voltage generation circuit; and a counting circuit coupled to the comparison circuit to perform an MSB counting operation according to the MSB comparison result signal outputted from the comparison circuit and to perform an LSB counting operation according to the LSB comparison result signal.

11. The comparison device of claim 10, wherein comparison circuit moves the first input signal to a desired voltage range by comparing the first input signal with the modified second input signal, and, after the first input signal has reached the desired voltage range, the comparison circuit compares the first input signal with a residue voltage and outputs the LSB comparison result signal.

12. The analog-to-digital conversion device of claim 10, wherein the comparison circuit repeatedly performs a comparison process multiple times during an analog-to-digital conversion, and wherein the comparison process compares the first input signal with the modified second input signal by the MSB voltage to find out how many MSB voltage steps are needed for the first input signal to move to the desired voltage range and produces the MSB comparison result signal at an initial time, and after the initial time, compares the first input signal of a residue range with the residue voltage to output the LSB comparison result signal.

13. The analog-to-digital conversion device of claim 10, wherein the control circuit includes:

a crossing detector structured to detect a crossing of the first input signal and the second input signal according to the MSB comparison result signal outputted from the comparison circuit to produce an output indicating a detection result of the crossing and to output an MSB voltage generation control signal to the MSB voltage generation circuit; and an MSB voltage size controller coupled to the crossing detector to receive the output thereof and operable to output an MSB voltage size control signal to the MSB voltage generation circuit according to a crossing detection result outputted from the crossing detector.

14. The analog-to-digital conversion device of claim 13, wherein the control circuit further includes:

an MSB voltage update controller coupled to the MSB voltage generation circuit to output an MSB voltage update control signal to the MSB voltage generation circuit.

15. The comparison device of claim 10, wherein the MSB voltage generation circuit includes:

an MSB voltage size adjuster coupled to the control circuit to receive the MSB voltage size control signal to adjust a magnitude of the MSB voltage;

an MSB voltage controller coupled to the control circuit to receive the MSB voltage generation control signal to control the generation of the MSB voltage; and an MSB voltage generator coupled to the MSB voltage size adjuster and the MSB voltage controller to generate the MSB voltage of which the size is adjusted by the MSB voltage size adjuster according to the control of the MSB voltage controller.

16. The analog-to-digital conversion device of claim 15, wherein the MSB voltage generation circuit further includes:

an MSB voltage updater coupled to the MSB voltage size adjuster to update the MSB voltage outputted from the MSB voltage generator according to an MSB voltage update control signal outputted from the control circuit.

17. The analog-to-digital conversion device of claim 10, wherein the first input signal is a pixel signal and the second input signal is an offset reference voltage.

18. The analog-to-digital conversion device of claim 10, wherein the first input signal is an offset reference voltage or a ramp signal and the second input signal is obtained by adding or subtracting the MSB voltage to or from a pixel signal.

19. A complementary metal oxide semiconductor (CMOS) image sensor, comprising:

a pixel array comprising pixels arranged in rows and columns wherein each pixel is operable to generate a pixel signal corresponding to incident light received at each pixel;

a row decoder coupled to the pixel array and operable to select and control pixels of the pixel array row by row;

a ramp signal generator structured to generate a ramp signal of a residue range;

a most significant bit (MSB) voltage generation circuit structured to generate an MSB voltage according to an MSB voltage control signal;

a comparison circuit suitable for comparing an offset reference voltage with a voltage at an input terminal of the comparison circuit obtained by adding or subtracting the MSB voltage to or from a pixel signal to modify the voltage at the input terminal to output an MSB comparison result signal, the comparison circuit comparing a ramp signal of a residue range with a residue voltage, which is the modified voltage at the input terminal, and outputting a least significant bit (LSB) comparison result signal;

a control circuit coupled to the comparison circuit to receive the comparison signal and operable to detect a crossing of the offset reference voltage and the modified voltage at the input terminal according to the MSB comparison result signal and to output the MSB voltage control signal to the MSB voltage generation circuit;

a counting circuit coupled to the comparison circuit to perform an MSB counting operation according to the MSB comparison result signal outputted from the comparison circuit and to perform an LSB counting operation according to the LSB comparison result signal;

a memory coupled to the counting circuit and operable to store information outputted from the counting circuit;

a column read-out circuit coupled to the memory and operable to output the information stored in the memory; and a control circuit coupled to and operable to control the row decoder, the ramp signal generator, the comparison circuit, the counting circuit, the memory and the column read-out circuit.

20. The comparison device of claim 19, wherein comparison circuit moves the voltage at the input terminal to a desired voltage range by comparing the offset reference voltage with the modified voltage at the input terminal and, after the voltage at the input terminal has reached the desired voltage range, the comparison circuit compares a ramp signal of a residue range with a residue voltage, which is the modified voltage at the input terminal and is in the desired voltage range, and outputs the LSB comparison result signal.

21. The CMOS image sensor of claim 19, wherein the comparison circuit repeatedly performs a comparison process multiple times during a row analog-to-digital conversion, and wherein the comparison process compares the offset reference voltage with the modified voltage at the input terminal to determine how many MSB voltage steps are to be added to or subtracted from the pixel signal to move to the desired voltage range and produces the MSB comparison result signal at an initial time, and after the initial time, compares the ramp signal of the residue range with the residue voltage to output the LSB comparison result signal.

22. A complementary metal oxide semiconductor (CMOS) image sensor, comprising:

a pixel array comprising pixels arranged in rows and columns wherein each pixel is operable to generate a pixel signal corresponding to incident light received at each pixel;

a row decoder coupled to the pixel array and operable to select and control pixels of the pixel array row by row;

a ramp signal generator structured to generate a ramp signal of a residue range;

a most significant bit (MSB) voltage generation circuit structured to an MSB voltage according to an MSB voltage control signal;

a comparison circuit suitable for comparing a pixel signal with an offset reference voltage that is modified by the MSB voltage outputted from the MSB voltage generation circuit to output an MSB comparison result signal, the comparison circuit comparing the pixel signal with a residue voltage to output a least significant bit (LSB) comparison result signal;

a control circuit coupled to the comparison circuit to receive the comparison signal and operable to detect a crossing of the pixel signal and the modified offset reference voltage according to the MSB comparison result signal outputted from the comparison circuit to output the MSB voltage control signal to the MSB voltage generation circuit;

a counting circuit coupled to the comparison circuit to perform an MSB counting operation according to the MSB comparison result signal outputted from the comparison circuit and to perform an LSB counting operation according to the LSB comparison result signal;

a memory coupled to the counting circuit and operable to store information outputted from the counting circuit;

a column read-out circuit coupled to the memory and operable to output the information stored in the memory; and a control circuit coupled to and operable to control the row decoder, the ramp signal generator, the comparison circuit, the counting circuit, the memory and the column read-out circuit.

23. The comparison device of claim 22, wherein comparison circuit moves the offset reference voltage to a voltage range of the pixel signal by comparing the pixel signal with the modified offset reference voltage and, after the offset reference voltage has reached the voltage range of the pixel signal, the comparison circuit compares the pixel signal with a residue voltage to output the LSB comparison result signal.

24. The CMOS image sensor of claim 22, wherein the comparison circuit repeatedly performs a comparison process multiple times during a row analog-to-digital conversion, and wherein the comparison process compares the pixel signal with the modified offset reference voltage to determine how many MSB voltage steps are to be added to or subtracted from the offset reference voltage to move to the residue range and produces the MSB comparison result signal at an initial time, and after the initial time, compares the pixel signal with the residue voltage to output the LSB comparison result signal.

* * * * *